United States Patent
Neron

(10) Patent No.: US 7,864,827 B1
(45) Date of Patent: Jan. 4, 2011

(54) SINGLE ENDED LASER DRIVING SYSTEM AND METHOD

(75) Inventor: Christophe Neron, Le Rouret (FR)

(73) Assignee: Mindspeed Technologies, Inc., Newport Beach, CA (US)

( * ) Notice: Subject to any disclaimer, the term of this patent is extended or adjusted under 35 U.S.C. 154(b) by 153 days.

(21) Appl. No.: 12/360,341

(22) Filed: Jan. 27, 2009

(51) Int. Cl.
*H01S 3/00* (2006.01)

(52) U.S. Cl. .................. 372/38.02; 372/38.07

(58) Field of Classification Search ............. 372/38.04, 372/38.07, 29.021
See application file for complete search history.

(56) References Cited

U.S. PATENT DOCUMENTS

| | | | |
|---|---|---|---|
| 5,777,772 A | 7/1998 | Araki | |
| 6,044,095 A * | 3/2000 | Asano et al. | 372/31 |
| 6,362,910 B1 * | 3/2002 | Tokita | 398/183 |
| 6,466,595 B2 * | 10/2002 | Asano | 372/29.021 |
| 6,618,406 B1 | 9/2003 | Kaminishi | |
| 6,798,802 B2 | 9/2004 | Chou | |
| 6,801,556 B2 * | 10/2004 | Fischer | 372/38.02 |
| 7,227,878 B1 | 6/2007 | Choi et al. | |
| 7,680,164 B1 | 3/2010 | Draper et al. | |
| 7,684,452 B1 | 3/2010 | Draper et al. | |

OTHER PUBLICATIONS

Sackinger, E. et al., "A 15-mW, 155-Mb/s CMOS Burst-Mode Laser Driver with Automatic Power Control and End-of-Life Detection," IEEE Journal of Solid-State Circuits, vol. 34, No. 12, Dec. 1999, pp. 1944-1950.

Sackinger, E. et al., "A 15-mW, 155-Mb/s CMOS Burst-Mode Laser Driver with Automatic Power Control and End-of-Life Detection," IEEE Journal of Solid-State Circuits, vol. 35, No. 22, Feb. 2000, pp. 269-274.

* cited by examiner

*Primary Examiner*—Tod T. Van Roy
*Assistant Examiner*—Tuan N. Nguyen
(74) *Attorney, Agent, or Firm*—Thomas, Kayden, Horstemeyer & Risley, LLP

(57) ABSTRACT

Disclosed are various embodiments of a single ended laser driving circuit. One embodiment includes a thin oxide gate switched by a data signal, the thin oxide gate configured to output a switching signal. The embodiment also includes a thick oxide current source configured to generate a bias current and a modulation current at a laser operating voltage, the modulation current based upon the switching signal, the thick oxide current source further configured to provide the bias current to the laser. The laser is configured to operate at the laser operating voltage based upon the modulation current and the bias current.

17 Claims, 6 Drawing Sheets

US 7,864,827 B1

SINGLE ENDED LASER DRIVING SYSTEM AND METHOD

BACKGROUND

Laser diodes are employed in digital optical data communications applications as they have relatively high bandwidth resulting in high data rates. In order to control a laser diode, a modulation reference current and a bias current are applied to the laser diode. A laser driving circuit can receive a data signal that drives a laser diode based upon the modulation reference current and the bias current. Typically, the bias current is that which is necessary to maintain a substantially constant "0" power level in the laser diode. The modulation reference current is that which is necessary to maintain a substantially constant "1" power level in the laser diode. In order to transmit data, the laser bias current and the modulation reference current are employed to cause the laser to transmit data using a constant "0" power level and a constant extinction ratio, which is the ratio between the "1" power level and the "0" power level. The operating voltage of many laser diodes can be approximately 3.3 V, and the modulation reference current as well as bias current may be incompatible with low power applications. As a result, data communication and/or communication via laser diode between components within a system may be hampered due to the power needs of a laser driving circuit.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

Figure 1:
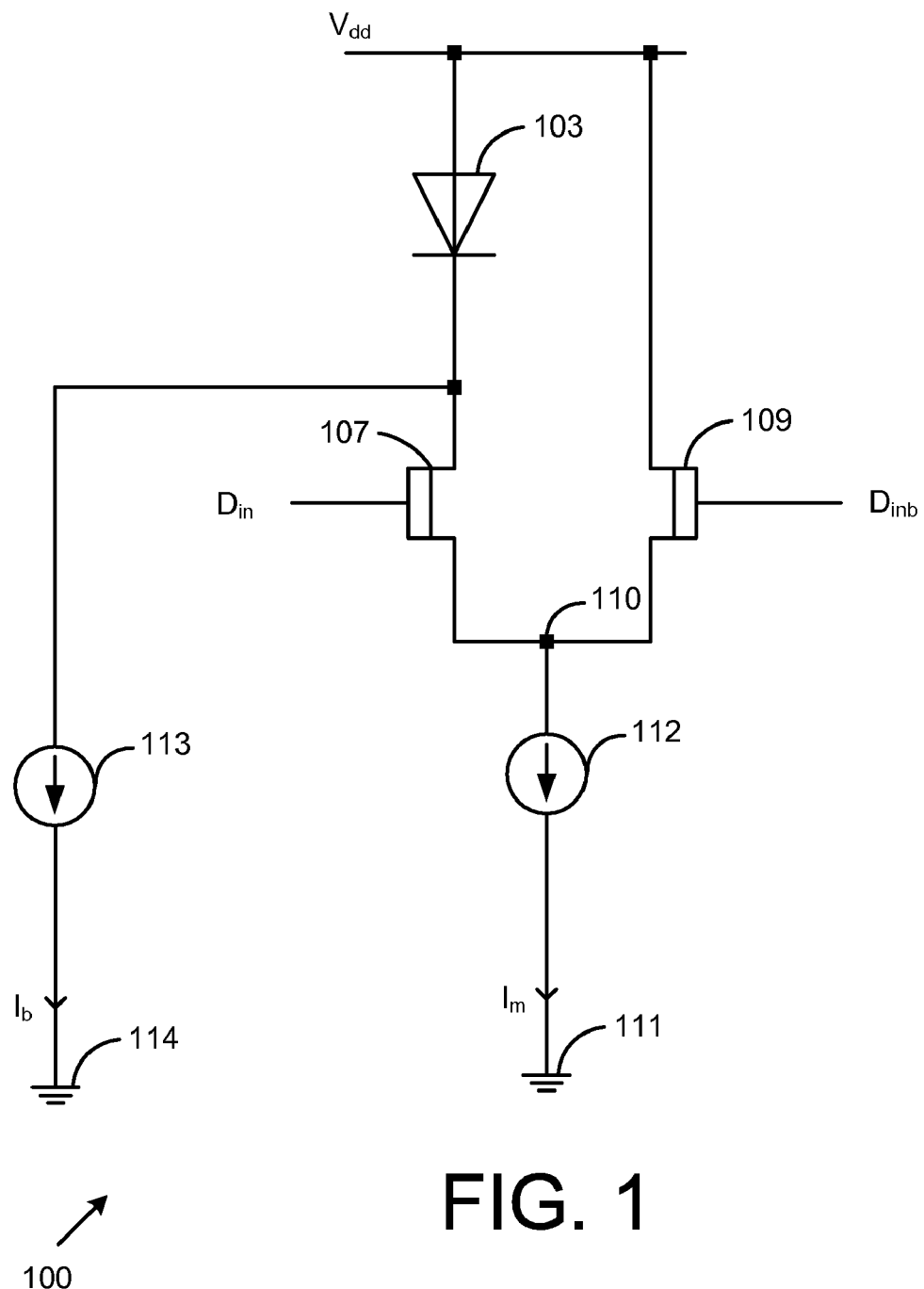
FIG. 1 is a schematic drawing of a differential laser driving circuit.

With reference to FIG. 1, shown is a laser driving circuit 100 including a laser diode 103. The depicted laser driving circuit 100 illustrates components that can switch and/or modulate a modulation current. It should be appreciated that a substantially constant bias current can be applied to a laser diode 103. The laser driving circuit 100 is configured to drive the laser diode 103 and generate a laser output that can be toggled between a logical "1" and a logical "0." In order to generate the laser output that toggles between the maximum laser output representing a logical "1" and the minimum laser output representing a logical "0" (which may be a laser output of "0"), the laser driving circuit 100 applies a laser driver signal to the laser diode 103 that toggles between corresponding maximum and minimum currents generated by the driving circuit 100. The maximum and minimum currents are generated by the laser driving circuit 100 based upon a bias current and a modulation current that are applied to the laser diode 103.

In this respect, the maximum current is generated by the laser driving circuit 100, for example, based upon a summation of the bias current and the modulation current. The minimum current is generated by the laser driving circuit 100, for example, based upon the bias current. In generating the maximum and minimum currents that are applied to the laser diode 103, the laser driving circuit 100 may amplify the bias current and the modulation current or may condition these currents in some other manner. The minimum current applied to a laser diode 103 is generally a minimum current necessary to ensure that the laser diode 103 is maintained in an operational state. In this respect, when the minimum current generated based upon the bias current is applied, the laser diode 103 operates just on the threshold of generating the laser radiation or may actually be generating a low level of the laser radiation. In one embodiment, the minimum current applied to the laser diode 103 is proportional to the bias current.

Also, the modulation current applied to the laser diode 103 is that which causes the laser diode 103 to generate laser radiation at a predefined power level as required by a relevant communication standard or other specification. The laser diode 103 receives bias current and modulation current from components of a laser driving circuit 100. In one configuration, a bias current source 113 is coupled to ground 114 and provides a bias current source. As can be appreciated, the laser diode 103 is driven by at least the minimum current generated based on the bias current so as to remain in the operational state as described above. If the minimum input signal is lost, then the laser diode 103 may transition into a non-operational state and would have to be restarted. In the event that this would occur, then the laser diode 103 would be non-operational for a small period of time after the application of the minimum current after the drop off, typically measured in nanoseconds, before laser diode 103 would be in a state in which it was capable of transmitting data. Where the laser diode 103 is employed for high-speed data communications purposes, such a delay may be very costly and result in non-optimal transmission which could lead to a loss of a significant amount of data. Also, the bias current and the modulation current may over time, or the laser output of the laser diode 103 may vary with respect to the magnitude of the laser driver current. Consequently, it is important to maintain proper thresholds of laser current applied to the laser diode 103 for proper continuous operation.

The depicted laser driving circuit 100 further illustrates components that modulate the flow of modulation current through the laser diode 103. The depicted modulation current source 112 is coupled to ground and can provide a modulation current for the laser diode 103. The laser diode 103 can draw a bias current as well as a modulation current from $V_{dd}$ in order to operate in a logical "1" status or a logical "0" status. Accordingly, the laser diode 103 is also coupled to a data gate 107, which receives as a data signal $D_{in}$ as a switching signal. The data gate 107 can further comprise a thick oxide gate that is further coupled to the voltage source $V_{dd}$ through which current may flow to ground 111 if the data gate 107 is activated. If the data gate 107 is activated, a modulation current as well as a bias current can flow through the laser diode 103, which can cause the laser to emit laser radiation, or operate in a logical "1" state.

An inverting gate 109 is also shown, which is coupled to V$_{dd}$ and inverts the data signal D$_{in}$ received as a switching signal. In other words, the inverting gate 109 can comprise a gate similar to the data gate 107 that receives an inverted data signal D$_{inb}$. The inverting gate 109 is employed to establish a virtual ground 110 such that while modulation current may not be flowing through the laser diode 103, as the data gate 107 is closed, the laser diode 103 can be quickly switched from a logical "0" state to a logical "1" state by modulating the data signal, as the data gate 107 is not coupled directly to ground and can therefore have a quicker ramp up time relative to a scenario including the data gate 107 coupled directly to ground 111.

The depicted data gate 107 and inverting gate 109 can further comprise a thick oxide device. It should be appreciated that the laser diode 103 can operate from various supply voltages (e.g., V$_{dd}$ from approximately 2V to 3.3V or above). Accordingly, to avoid damage to the data gate 107, inverting gate 109, the laser diode 103, and/or other components of the laser driving circuit 100, one or more transistors incorporated in the data gate 107 and/or inverting gate 109 can be implemented as a thick oxide device. In addition, employing such thick oxide device(s) can facilitate avoiding the exceeding of breakdown voltage of various components of the laser driving circuit 100.

In other embodiments, the data gate 107 and inverting gate 109 can include one or more thick oxide n-field effect transistors. Additionally, the thick oxide devices employed can include a pre-driver to facilitate fast switching of the gates by reducing the amount of time required to charge a gate when activating it. It should be appreciated that because the depicted laser driving circuit 100 employs a common source virtual ground 110, the laser diode 103 can be operated with very little ground bounce or data dependent jitter. However, the depicted laser driving circuit has relatively weak power efficiency, as the circuit is consuming the same amount of power whether the laser is in a logical "1" state or a logical "0" state. The depicted laser driving circuit 100 consumes power substantially equivalent to the amount of power consumption corresponding to the flow of bias current as well as the modulation current employed to place the laser diode 103 in a logical "1" state. In other words, when the laser diode 103 is in a logical "0" state, current is flowing through the inverting gate 109, and when the laser diode 103 is in a logical "1" state, current is flowing through the laser diode 103 and the data gate 107. Alternatively, one expression of the average power consumption of the circuit 100 can include the following:

AveragePower=V$_{dd}$(I$_b$+I$_m$)

Figure 2:
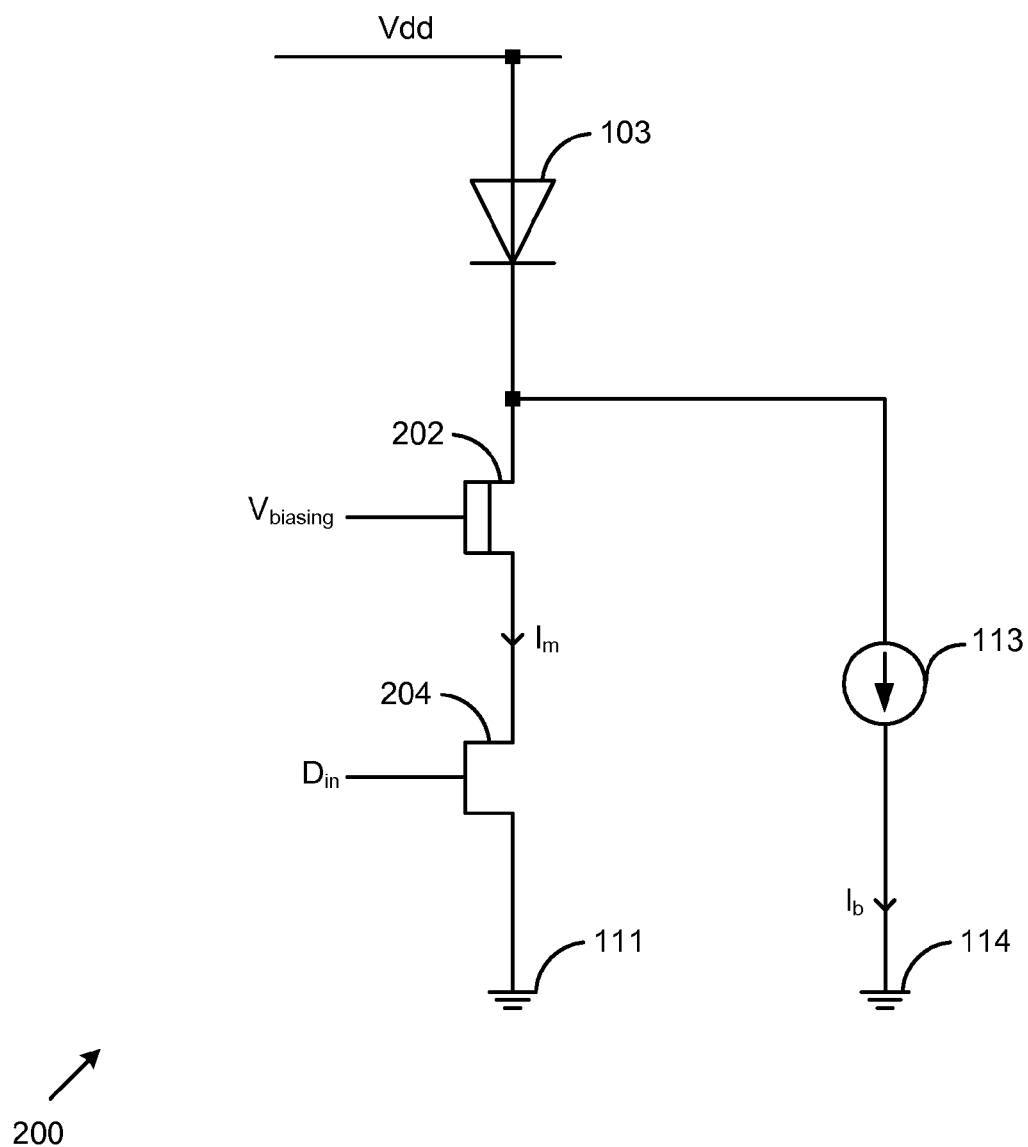
FIG. 2 is a schematic drawing of a single ended laser driving circuit in accordance with an embodiment of the disclosure.

Accordingly, reference is now made to FIG. 2, which depicts a single ended laser driving circuit 200 in accordance with an embodiment of the disclosure. FIG. 2 illustrates a logical configuration of components configured to control the flow of modulation current through a laser diode 103, as a minimum bias current can always be provided to a laser diode 103. The single ended laser driving circuit 200 is configured to drive a laser diode 103 in a configuration that consumes less power relative to the laser driving circuit 100 (FIG. 1). In the depicted embodiment, the laser diode is coupled to V$_{dd}$, or a voltage source from which a bias current and a modulation current can be provided in order to drive the laser at a laser operating voltage. It should be appreciated that a laser can operate in an approximate 3.3V power domain. Accordingly, in one example, V$_{dd}$ can be an approximate 3.3V voltage source.

The laser diode 103 can further be coupled to a thick oxide current source 202 through which a bias current and a modulation current can be drawn. The gate of the thick oxide current source 202 is a low impedance node that is not switched or modulated by a data signal. Alternatively, a bias voltage (e.g., V$_{biasing}$) can be applied to the gate of a thick oxide device to cause the thick oxide current source 202 to remain in a conductive state. In other words, the thick oxide current source 202 is always "on." The thick oxide current source 202 can further be coupled to a thin oxide gate 204. The thin oxide gate 204 can be coupled to ground and switched by a data signal D$_{in}$. The thin oxide gate 204 can be configured to operate in a lower voltage power domain relative to the thick oxide current source 202. In one embodiment, the thin oxide gate 204 can be configured to operate in an approximate 1.2V power domain, whereas the thick oxide current source 202 and the laser diode 103 can be configured to operate in a 3.3V power domain, or at a laser operating voltage required by the laser diode 103.

The thin oxide gate 204 can further comprise one or more thin oxide devices, such as at least one thin oxide n-field effect transistor. Additionally, the data signal D$_{in}$ can be provided as a switching signal that can facilitate toggling of the laser diode 103 from a logical "1" and/or a logical "0" state. In order to be employed in high speed communications systems, which can operate at data rates on the order of one gigabit per second and greater, the single ended laser driving circuit 200 should be able to modulate a modulation current configured to cause the laser to operate at a logical "0" or "1" at high speeds. In addition, in order to be employed in low power applications such as a handheld electronic and/or communications device, the single ended laser driving circuit 200 can facilitate lower power consumption relative to the laser driving circuit 100 of FIG. 1. The single ended laser driving circuit 200 is, relative to the laser driving circuit 100 of FIG. 1, configured to consume less power when the data signal D$_{in}$ is a logical "0." In addition, the thin oxide gate 204 can be operated in a different power domain relative to the laser diode 103 and the thick oxide current source 202. Therefore, data signal D$_{in}$ that is provided as a switching signal can be provided at a lower voltage relative to the laser operating voltage V$_{dd}$, which can also facilitate lower power consumption.

It should be appreciated that when the data signal D$_{in}$ is a logical "0," or the thin oxide gate 204 is switched to a closed position, the single ended laser driving circuit 200, unlike the laser driving circuit 100 of FIG. 1, does not consume power that would accompany current flow substantially equivalent to a modulation current. A bias current can still be provided to the laser diode 103 as a minimum operating current as noted above, but power consumption attributable to a laser modulation current can be reduced when the data signal D$_{in}$ is a logical "0" relative to the laser driving circuit 100 of FIG. 1. In other words and assuming a DC-balanced Pseudo Random Bit Stream (PRBS), one expression of power consumption of the single ended laser driving circuit 200 can include the following:

$$AveragePower = V_{dd}\left(I_b + \frac{I_m}{2}\right)$$

In order to facilitate switching of the laser diode 103 at high speeds for high speed applications, the thick oxide current source 202 can provide a bias current and/or modulation current at the proper laser operating voltage of the laser diode 103. Because the thin oxide gate 204 operates at a lower operating voltage than the operating voltage of the laser, the thin oxide gate 204 cannot directly switch current flow through the laser diode 103. In addition, in order to ensure integrity in high speed applications, the thick oxide current source can ensure adequately fast ramp up time when the laser diode 103 is toggled between a logical "0" or "1."

Accordingly, the depicted single ended laser driving circuit 200 of FIG. 2 depicts the flow of a modulation current that causes the laser to transition from a logical "0" to a logical "1," or vice versa. It should be appreciated that a bias current can always be provided to the laser diode 103 when a device incorporating the laser diode 103 is in use, which is noted above. In the depicted single ended laser driving circuit 200, when the thin oxide gate 204 receives a data signal $D_{in}$ corresponding to a logical "1," the thin oxide gate 204 can facilitate a modulation current being provided to the laser diode 103 and flowing through the thick oxide current source 202, the thin oxide gate 204, and to ground 111, which can cause the laser diode 103 to transition to a logical "1." The thick oxide current source 202 can provide adequate modulation current at a proper laser operating voltage and amperage. If the thin oxide gate 204 receives a data signal $D_{in}$ corresponding to a logical "0," then the thin oxide gate 204 can substantially stop the flow of modulation current from $V_{dd}$ through the laser diode 103 to ground 111, which causes the laser diode 103 to transition to a state corresponding to logical "0."

The thick oxide current source 202 can, in one embodiment, be implemented as a current mirror configured to allow modulation and/or bias current at a laser operating voltage and amperage to flow through the laser diode 103 in response to the switching of the thin oxide gate 204, which operates at a potentially lower voltage and amperage. The thick oxide current source 202 can also be implemented with other structure and/or devices configured to provide adequate modulation current and/or bias current to the laser diode 103, such as, for example, a current amplifier, various current mirror structures, and other device as can be appreciated.

Figure 3:
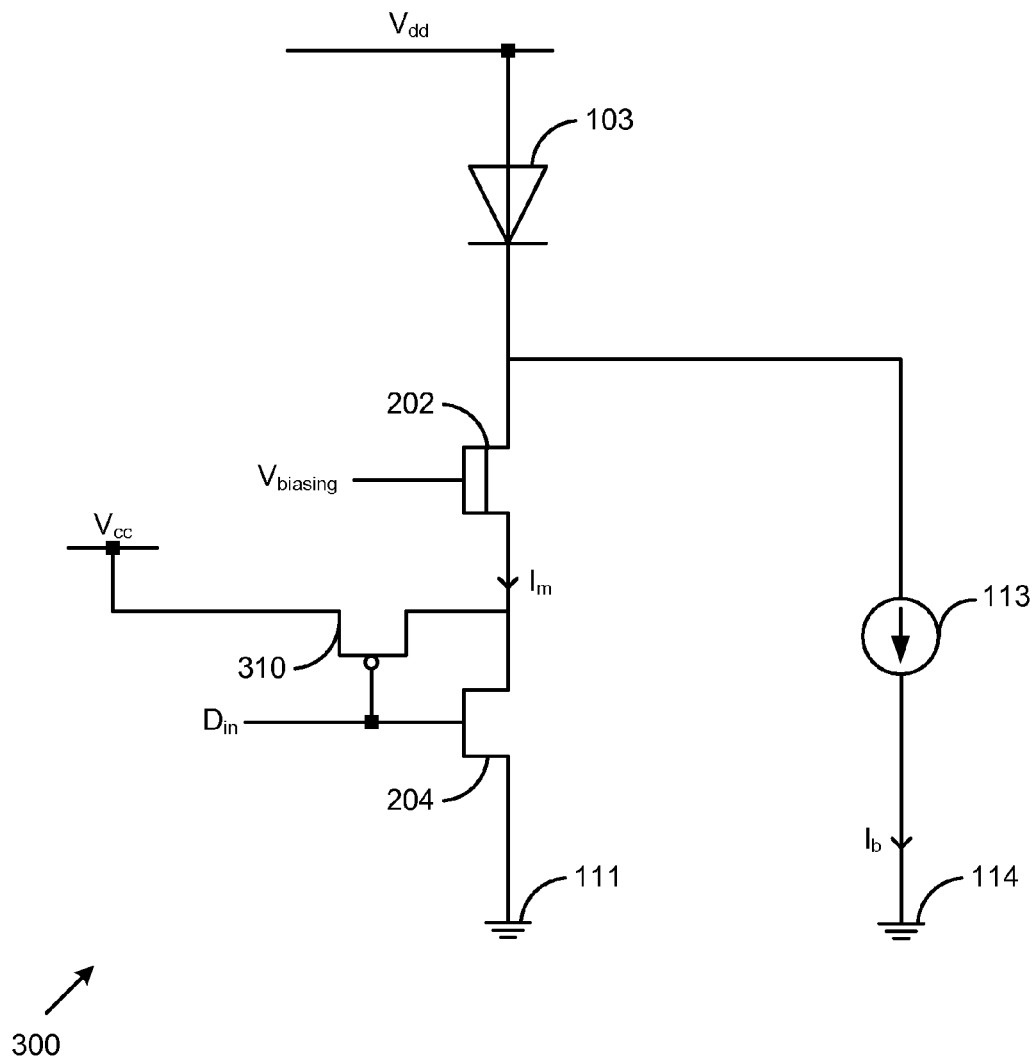
FIG. 3 is a schematic drawing of an alternative single ended laser driving circuit according to an embodiment of the disclosure.

With reference to FIG. 3, shown is an alternative example of a single ended laser driving circuit 300 in accordance with an embodiment of the disclosure. As noted above in reference to FIG. 2, it should be appreciated that the depicted circuit of FIG. 3 illustrates a logical configuration of components configured to control the flow of modulation current through a laser diode 103, as a minimum bias current can always be provided to a laser diode 103. In the depicted example, a laser diode 103 is coupled to a voltage source $V_{dd}$ which is configured at a laser operating voltage. The laser diode 103 is further coupled to a thick oxide current source 202, which is coupled to a thin oxide gate 204. The thin oxide gate 204 is coupled to ground and is configured to receive as a switching signal a data signal $D_{in}$.

Also shown is a thin oxide inverting gate 310, which is also coupled to the thick oxide current source 202. In the depicted example, a bias voltage (e.g., $V_{biasing}$) can be applied to gates comprising the thick oxide current source 202 to cause the thick oxide current source 202 to remain in a conductive state. In other words, the thick oxide current source 202 is always "on." In contrast to the thin oxide gate 204, which is coupled to ground, the thin oxide inverting gate 310 connects to a voltage source $V_{cc}$, which can be configured at a voltage lower than the laser operating voltage $V_{dd}$ and/or bias voltages employed for the thick oxide current source 202. In one embodiment $V_{cc}$ can be configured at approximately 1.2V, and the laser operating voltage Vdd can be configured at approximately 3.3V to 3.6V. Other voltages can be employed such that they communicate a logical "0" and/or a logical "1." The depicted alternative single ended laser driving circuit 300 allows the laser diode 103 to be driven with less data dependent jitter relative to the single ended laser driving circuit 200 of FIG. 2.

The thin oxide inverting gate 310 receives the data signal $D_{in}$ as a switching signal and inverts the data signal. Accordingly, if a data signal $D_{in}$ corresponding to a logical "0" is received by the thin oxide inverting gate 310, gate will be opened, causing the thick oxide current source to be coupled to $V_{cc}$. In the same scenario, the thin oxide gate 204 can be closed. Accordingly, the thick oxide current source 202, which can be implemented as a current mirror, can cause modulation current to substantially cease its flow through from the voltage source $V_{dd}$ through the laser diode 103. If a data signal corresponding to a logical "1" is received by the thin oxide inverting gate 310, the gate will be closed, and modulation current can flow from the voltage source $V_{dd}$ through the laser diode 103, thick oxide current source 202, thin oxide gate 204, and then to ground 111, as noted above in reference to FIG. 2.

Figure 4:
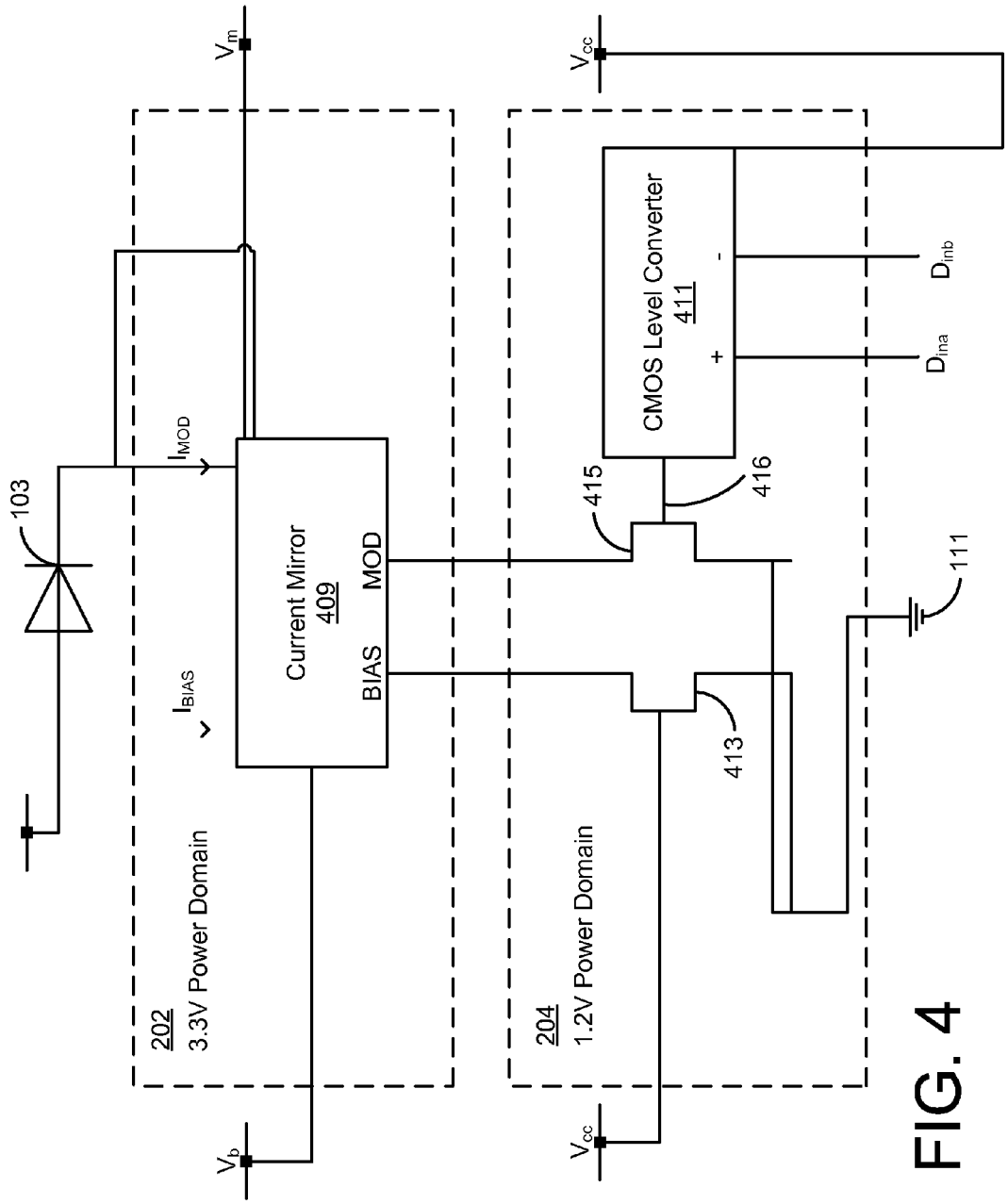
FIG. 4 is an alternative depiction of the single ended laser driving circuit of FIG. 2 according to an embodiment of the disclosure.

With reference to FIG. 4, shown is one alternative depiction of the single ended laser driving circuit 200 of FIG. 2. FIG. 4 illustrates one possible implementation of a single ended laser driving circuit 400. The depicted laser driving circuit 400 includes a laser diode 103 coupled to a voltage source $V_{dd}$. The laser diode 103 is further coupled to the thick oxide current source 202, which can operate, in the depicted non-limiting example, in the 3.3V power domain, or the laser operating voltage.

As noted above, a bias voltage (e.g., $V_b$, $V_m$) can be applied to gates comprising the thick oxide current source 202 and/or components therein to cause the thick oxide current source 202 to remain in a conductive state. In other words, the thick oxide current source 202 is always "on." A bias voltage can be selected to place the thick oxide current source 202 in an always on state. However, bias voltages can be chosen that are less than a laser operating voltage if they place the thick oxide current source 202 in a substantially conductive state. In other words, the bias voltages can be chosen such that they allow current to flow through the thick oxide current source 202 to provide the laser diode 103 with biasing current and/or modulation current. Various other components that can be included in the thick oxide current source 202, such as amplifiers, capacitors, resistances, loads, logic gates, and other components are not shown for ease of depiction.

The thick oxide current source 202 includes a current mirror 409 coupled to the voltage source $V_{dd}$ operating at the laser operating voltage. The current mirror 409 is configured to provide a bias current $I_{BIAS}$ to the laser diode 103 as described above. The current mirror 409 is also configured to provide a modulation current $I_{MOD}$, which can cause the laser diode 103 to toggle between a logical "0" or logical "1" as can be appreciated. In the depicted example, the above noted bias voltages can be provided to gates comprising the current mirror 409 in order to place the current mirror 409 in an always on state. As noted above, the thick oxide current source 202, via the current mirror 409, can provide current at a proper operating voltage and amperage of the laser diode 103 depending on a data signal, or switching signal, provided to the thin oxide gate 204. Accordingly, the current mirror 409 can receive as inputs a BIAS and MOD signal from the thin oxide gate 202, which are translated into the bias current $I_{BIAS}$ and modulating current $I_{MOD}$ at the proper operating voltage and amperage in order to operate the laser diode 103.

The current mirror 409 can be implemented using various configurations that should be appreciated. For example, the current mirror can be implemented using current mirror configurations that can include, but are not limited to: a transistor current mirror, a MOSFET current mirror, feedback assisted current mirror, a Widlar current source, a Wilson current source, a cascoded current source, or other current mirror, current amplifier and/or current source, as can be appreciated.

The thin oxide gate 204 includes various components to generate the above noted BIAS and MOD signals. The thin oxide gate 204 includes a BIAS gate 413, which provides a substantially constant BIAS signal the current mirror 409. The BIAS gate 413 allows a substantially constant bias current $I_{BIAS}$ to flow from the laser diode 103 through the current mirror 409 to ground 111 at the proper operating voltage and amperage of the laser diode 103.

The thin oxide gate also includes a CMOS level converter 411, which can receive a differential data signal $D_{ina}$ and $D_{inb}$. The CMOS level converter 411 can convert the differential data signal into a CMOS level data signal 416 that can be provided as a switching signal to the MOD gate 415 to control the modulation current $I_{MOD}$ provided to the laser diode 103. If a logical "1" is provided as the CMOS level data signal 416 to the MOD gate 415, the current mirror 409 can allow modulation current $I_{MOD}$ to flow through the laser diode 103 to ground 111. Therefore, the laser diode 103 can be placed in a logical "1" state. If a logical "0" is provided as the CMOS level data signal 416 to the MOD gate 415, modulation current $I_{MOD}$ will not flow through the laser diode 103, and the laser diode 103 can be placed in a logical "0" state.

It should be appreciated that the above configuration may be varied in accordance with an embodiment of the disclosure. In one alternative embodiment, a differential data signal may not be provided that requires a CMOS level converter. In this example, a CMOS level signal can be provided directly to the thin oxide gate 204 as a switching signal.

Figure 5:
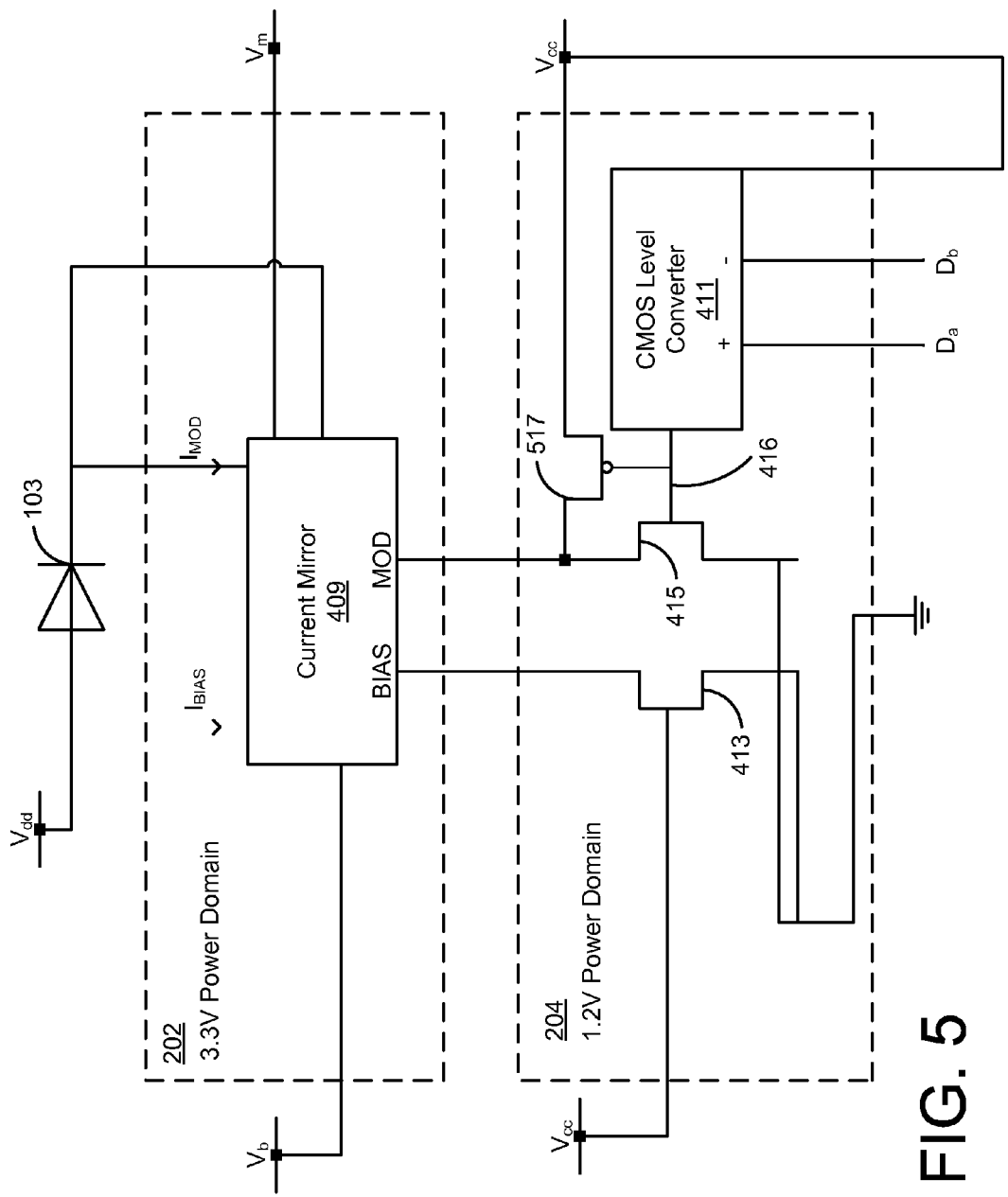
FIG. 5 is an alternative depiction of the single ended laser driving circuit of FIG. 3 according to an embodiment of the disclosure.

With reference to FIG. 5, shown is one alternative depiction of the single ended laser driving circuit 300 of FIG. 3. FIG. 5 illustrates one possible implementation of a single ended laser driving circuit 500. Similar to the embodiment of FIG. 4, the depicted laser driving circuit 500 includes a laser diode 103 coupled to a voltage source $V_{dd}$. The laser diode 103 is further coupled to the thick oxide current source 202, which operates, in the depicted non-limiting example, in the 3.3V power domain, or the laser operating voltage.

The single ended laser driving circuit 500 also includes the current mirror 409, CMOS level converter 411, BIAS gate 413 and MOD gate 415 as described above in reference to FIG. 4. In addition, the single ended laser driving circuit 500 includes an inverted MOD gate 517 coupled to a voltage source $V_{cc}$ in the power domain of the thin oxide gate 204. The inverted MOD gate 517 is configured to couple the MOD input of the current mirror 409 to $V_{cc}$ when the CMOS level data signal corresponds to a logical "0." In this event, the current mirror 409 will not cause modulation current to flow through the laser diode 103 through the current mirror 409 and MOD gate 415 to ground 111. Therefore, the laser can be placed in a logical "0" state.

Figure 6:
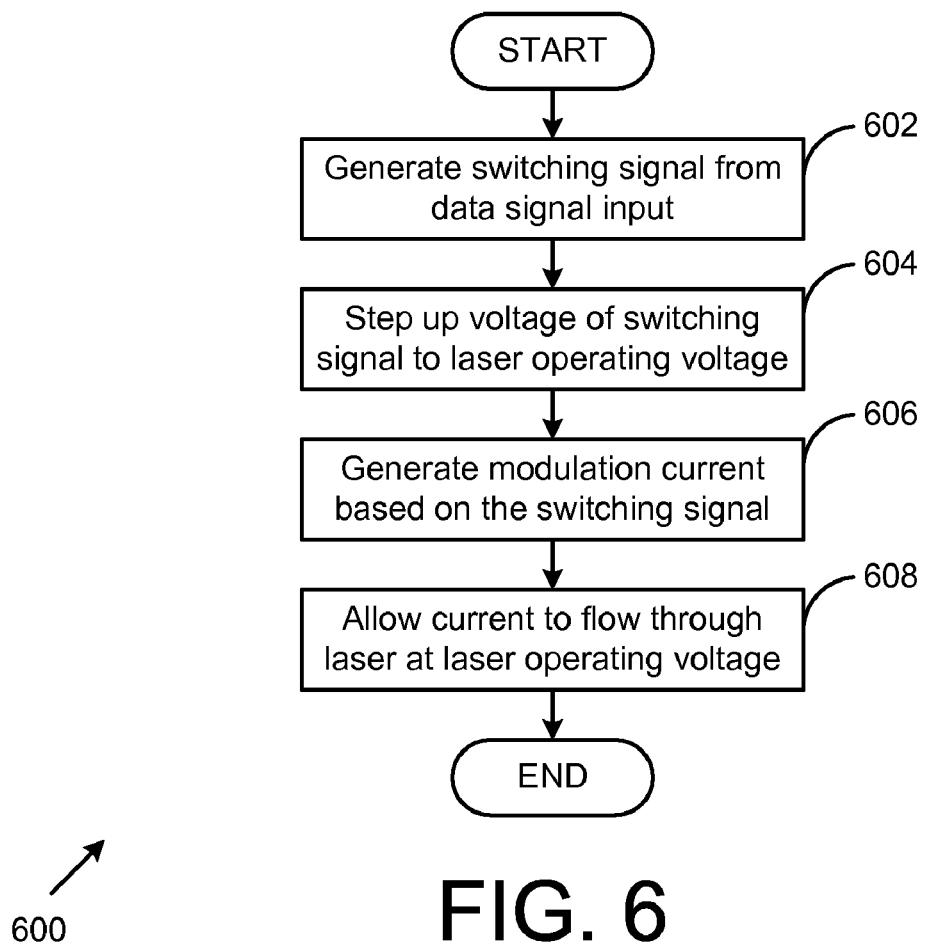
FIG. 6 is a drawing of a process in accordance with an embodiment of the disclosure.

Reference is now made to FIG. 6, which depicts one example of the execution of a single ended laser driving circuit in accordance with an embodiment of the disclosure. The flowchart may also be viewed as depicting steps of a method 600 implemented in accordance with various embodiments of the disclosure. It is understood that the flowchart of FIG. 6 is merely an example of functionality of a single ended laser driving circuit, and that other functions may be implemented in a single ended laser driving circuit as described herein.

In this respect, in box 602, a switching signal is generated from a data signal input. As noted above, a data signal can be provided as an input, which can be converted into a CMOS level signal 416 (FIG. 4) by a CMOS level converter 411 (FIG. 4). In box 604, the voltage of the switching signal is stepped up to a laser operating voltage. A thick oxide current source and/or current mirror can facilitate stepping up the voltage of the switching signal that can be used to generate a modulation current provided to a laser diode 103 (FIG. 2) in box 606. In box 608, modulation current is allowed to flow through a laser diode 103 based upon the switching signal. In this way, a laser diode 103 can be modulated based upon a low voltage and/or low current data input signal relative to the laser operating voltage and/or amperage.

Although the flowchart of FIG. 6 shows a specific order of execution, it is understood that the order of execution may differ from that which is depicted. For example, the order of execution of two or more blocks may be scrambled relative to the order shown. Also, two or more blocks shown in succession in FIG. 6 may be executed concurrently or with partial concurrence.

It should also be emphasized that the above-described of embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A single ended laser driving circuit system, comprising:
a thin oxide gate switched by a data signal, the thin oxide gate configured to output a switching signal;
a thick oxide current source configured to generate a bias current and a modulation current at a laser operating voltage, the modulation current based upon the switching signal, the thick oxide current source further configured to provide the bias current to the laser;
wherein the laser is configured to operate at the laser operating voltage based upon the modulation current and the bias current;
wherein the thin oxide gate is coupled to a ground and is configured to activate the laser by causing current supplied by the thick oxide current source to flow through the laser and to the ground when the data signal indicates that the laser should be activated;
wherein the thin oxide gate further comprises a first at least one n-channel field effect transistor and the thick oxide current source further comprises a second at least one n-channel field effect transistor having an oxide thickness greater than the first at least one n-channel field effect transistor; and
wherein the thick oxide current source further comprises a current mirror circuit configured to step up a switching voltage of the switching signal, wherein the laser operating voltage is greater than the switching voltage, the current mirror circuit further configured to provide a modulation current and a bias current to the laser.

2. The single ended laser driving circuit system of claim 1, further comprising a CMOS level converter configured to generate the switching signal from the data signal, wherein the data signal is a differential data signal.

3. The single ended laser driving circuit system of claim 1, wherein the laser is further configured to emit an optical signal based upon the switching signal.

4. The single ended laser driving circuit system of claim 1, wherein the laser operating voltage is approximately 3.3V.

5. The single ended laser driving circuit system of claim 1, wherein the thin oxide gate is configured to output the switching signal as a CMOS level signal having a first voltage and a first amperage.

6. The single ended laser driving circuit system of claim 5, wherein the first voltage is approximately 1.2 volts and the laser operating voltage is approximately 3.3 volts.

7. The single ended laser driving circuit system of claim 5, wherein the data signal is a differential signal and thin oxide gate is configured to convert the data signal to the switching signal, wherein the switching signal is a CMOS level signal.

8. The single ended laser driving circuit system of claim 5, wherein the thick oxide current source modulates the modulation current, the modulation current combined with a bias current to drive the laser.

9. A method for driving a laser diode in a single ended laser driving circuit, comprising the steps of:
   generating a switching signal from a data signal, the switching signal generated at a switching voltage, the switching signal generated by a thin oxide gate;
   generating a bias current and a modulation current at a laser operating voltage, the modulation current based upon the switching signal, wherein a thick oxide current source is configured to provide the bias current to the laser;
   operating the laser at the laser operating voltage based upon the modulation current and the bias current, wherein the laser operating voltage is higher than the switching voltage;
   wherein the thin oxide gate is coupled to a ground and is configured to activate the laser by causing current supplied by the thick oxide current source to flow through the laser and to the ground when the data signal indicates that the laser should be activated;
   wherein the thin oxide gate further comprises a first at least one n-channel field effect transistor and the thick oxide current source further comprises a second at least one n-channel field effect transistor having an oxide thickness greater than the first at least one n-channel field effect transistor; and
   wherein the thick oxide current source further comprises a current mirror circuit configured to step up a switching voltage of the switching signal, wherein the laser operating voltage is greater than the switching voltage, the current mirror circuit further configured to provide a modulation current and a bias current to the laser.

10. The method of claim 9, further comprising the step of converting the data signal to a CMOS level signal, wherein the data signal is a differential data signal.

11. The method of claim 9, further comprising the step of emitting an optical signal based upon the switching signal.

12. The method of claim 9, wherein the laser operating voltage is approximately 3.3V.

13. The method of claim 9, further comprising the step of outputting the switching signal as a CMOS level signal having a first voltage and a first amperage.

14. The method of claim 13, wherein the first voltage is approximately 1.2 volts and the laser operating voltage is approximately 3.3 volts.

15. The method of claim 13, wherein the data signal is a differential signal and the step of generating the switching signal further comprises the step of converting the differential signal to the switching signal, the switching signal a CMOS level signal.

16. The method of claim 13, further comprising the step of modulating the modulation current, the modulation current combined with a bias current to drive the laser.

17. The method of claim 9, further comprising the steps of
   stepping up the switching voltage of the switching signal, wherein the laser operating voltage is greater than the switching voltage; and
   providing a modulation current and a bias current to the laser.

* * * * *